Figure 1:
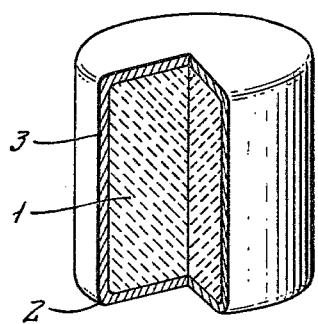

United States Patent [19]

Seifert

[11] 4,196,058

[45] Apr. 1, 1980

[54] ELECTRICAL GALVANIC BATH CONTACT ELEMENT

[75] Inventor: Christian Seifert, Germersberg, Fed. Rep. of Germany

[73] Assignee: Stettner & Co., Nuremberg, Fed. Rep. of Germany

[21] Appl. No.: 938,386

[22] Filed: Aug. 31, 1978

Related U.S. Application Data

[62] Division of Ser. No. 854,076, Nov. 23, 1977, abandoned.

[51] Int. Cl.$^2$ .................. C25D 5/02; C25D 17/16
[52] U.S. Cl. .................................. 204/15; 204/194
[58] Field of Search ............ 204/14 R, 15, 194, 213, 204/214, 20, 23

[56] References Cited

U.S. PATENT DOCUMENTS

| | | | |
|---|---|---|---|
| 2,762,772 | 9/1956 | Jackson | 204/213 |
| 3,340,174 | 9/1967 | Buynak | 204/213 |
| 3,690,921 | 9/1972 | Elmore | 427/305 |
| 3,992,160 | 11/1976 | Marzocchi | 428/406 |

FOREIGN PATENT DOCUMENTS

| | | | |
|---|---|---|---|
| 16659 | 7/1965 | Japan | 204/213 |
| 1204902 | 9/1970 | United Kingdom | 204/213 |

*Primary Examiner*—T. M. Tufariello
*Attorney, Agent, or Firm*—Frishauf, Holtz, Goodman & Woodward

[57] ABSTRACT

To provide for uniform distribution of contact element bodies which are placed in a drum immersed in a galvanic bath and to provide contact to the metallic coating on components, the metallic coating of which is to be reinforced by galvanic deposition, the contact elements comprise tiny, especially cylindrical cores made of a material having approximately the same order of magnitude of specific gravity as the components, for example being made of a similar material, of glass, plastic, or the like, and coated with a metallic coating on the outside, essentially entirely covering the cores. The coating may be nickel or copper, and for use with tiny capacitors, lead-through elements, and the like, a preferred size of about the same length as diameter of the coated e.g. cylindrical cores is suitable, for example about 3 mm length and diameter. These elements can be made by multiple dry extrusion, with the edges rounded off before being coated.

17 Claims, 4 Drawing Figures

ELECTRICAL GALVANIC BATH CONTACT ELEMENT

This is a division of application Ser. No. 854,076, filed Nov. 23, 1977, now abandoned.

The present invention relates to a method of providing electrical contacts to a metallization coating on components, especially on ceramic substrates which form tiny electronic components, such as capacitors with exposed terminals, feed-through or lead-through ceramic elements and the like, located in a galvanic bath.

Background and Prior Art.

The electrical industry uses circuit components made of insulating material with exposed contact strips in great quantities. Typical elements of this type are capacitors, resistors, coils, bus bar strips, and the like, which may be of tiny dimensions, using a ceramic or other insulating material as a base on which the exposed contacts are applied in the form of a metallized coating. These metallized coatings are very thin and to permit external application of conductors, it is desirable to reinforce the coatings at least where they are exposed. This reinforcement of these small circuit elements is usually carried out in galvanic baths placed in drums so that, by galvanic deposition, the contact layers are reinforced. In order to provide for galvanic deposition, however, the contact layers must be connected to a source of electrical potential. The problem of contacting these contact layers then with a proper operating voltage arises. Contacting these layers, in the bath, has been done by mixing in with the e.g. electrical components electrically conductive contact elements. The elements are retained in a drum which is rotated and the contact elements, due to their presence, provide random contacting of the contact strips or layers on the ceramic electrical elements, an electrical voltage being applied to the drum, usually by passing an electrically conductive shaft therethrough so that, upon rotation, the contact layers on the electrical components will have a direct electrical connection between the cathode, typically formed by the central shaft of the drum through these contact elements. In the past, the contact elements usually were steel balls, for example of the type used for ball bearings.

It has been found that the use of steel balls to establish contact with exposed layers or coatings of electrically conductive materials on insulating substrates has some disadvantages. Particularly after an extended dwell time of the contact elements in the drum, the contacts made by these steel balls between the cathode of the bath, typically the rotation shaft of the drum, and the metallized coating layers becomes poorer and poorer and, eventually may be entirely interrupted.

The Invention

It is an object to establish good electrical contact between the cathode in a galvanic bath, when intermixed with metal coated components, and in which the electrical contact established by the contact element between the shaft and the components will not deteriorate during the treatment time of the elements in the bath.

Briefly, the invention proceeds from the discovery that the decrease in contacting efficiency of the previously used steel balls is apparently due to a separation of the steel balls from the intimate intermixture with the components after the drum in which, initially, the steel balls and the contact elements were mixed, has been in operation for some time.

In accordance with the present invention, the bath has mixed therein contacting elements are cores particularly made in essentially cylindrical form, shaped as cylindrical cores made of a material of low specific gravity, preferably of a specific gravity approximately in the order of the specific gravity of the components to be contacted. These cores are coated or covered with a metal jacket.

Adding contacting elements, which due to a polygonal shape or the essentially cylindrical shape, effectively provide an extended contact surface which is substantially greater than that of the previously used steel balls, permits galvanic deposition of reinforcing material on the contact strips of the electrical components at lower voltage than heretofore. Separation of the e.g. cylindrical contact elements from the electrical components to be coated after the treatment can readily be obtained by means of suitable sieves.

Preferably, the core of the contact element is made of ceramic, glass or plastic, and the metal jacket surrounding the core is made of nickel applied, for example, by use of generally known and standard metallizing processes.

Figure 2:
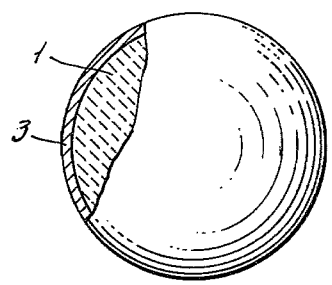
Figure 3:
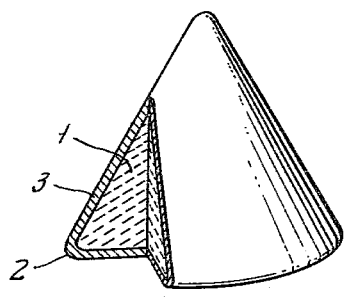
Figure 4:
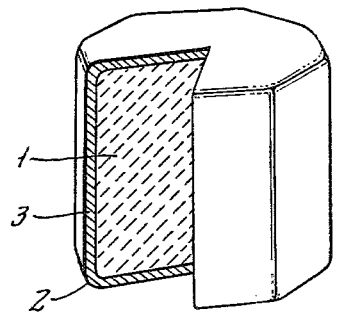

Drawing, illustrating an example, wherein FIG. 1 is a schematic longitudinal section through a generally preferred exemplary embodiment of a contacting element; and FIGS. 2–4 illustrate other shapes of contacting elements.

The contacting element—see FIG. 1—in preferred form, has an essentially cylindrical core 1 made of a material having low specific gravity, matching approximately the specific gravity of the elements to be treated. Suitable materials are ceramic, glass or plastic. The edges 2 between the cylindrical surface and the end faces of the contact elements are slightly rounded. The cylindrical core 1 is completely surrounded by a metal skin 3 applied by a suitable metallizing process. The metal skin 3 tightly fits around the cylindrical core 1 and the rounded edges 2, where the cylindrical surface merges into the end faces, so that the entire contact body has essentially cylindrical shape with rounded edges. The diameter of the cylinder corresponds approximately to the length thereof, for example about 3 mm length, and 3 mm diameter.

The specific gravity of the contact element corresponds at least roughly to the specific gravity of the components to be contacted. Preferably, it is roughly matched thereto. To prevent separation of the components e.g. electrical elements and the contacting body upon rotation of the contacting drum within the galvanic bath, the specific gravity of the contacting bodies as such—that is, core 1 and metal skin 3—should match at least approximately the specific gravity, overall, of the electrical components. This reliably insures that the contact elements and the components are intimately mixed at all times, and that separation is prevented. If the (e.g. electrical) components are made of ceramic, particularly of ceramic composition containing steatite, porcelain, or titanium oxide, then contact elements are particularly suitable which are made as e.g. polygonal or cylindrical bodies or balls having a core of steatite of specification DIN No. 40,685. The metal skin surrounding the steatite core preferably is made of nickel. Components having a higher specific gravity, for example components made of, or substantially including, barium titanate preferably are mixed with cylindrical contact elements having a ceramic core of a correspondingly higher specific gravity. Preferably, a cylindrical core has a length which corresponds to its diameter, and the cores as aforesaid preferably are about 3 mm long, with a diameter of approximately 3 mm. Such contacting elements are particularly easily separated from components after galvanic treatment thereof. The rounded corners 2 of the intersection of the cylindrical (or polygonal) surface and the end faces of the essentially cylindrical elements prevent damage both to the bodies as well as to the electrical components which are being treated.

Contacting elements with an essentially cylindrical core of steatite can be made simply and economically by dry extrusion in a multiple extrusion press. The edges of the cylindrical steatite cores are then rounded easily by a suitable abrasion treatment. The abraded, rounded, smooth steatite cores are then coated with a suitable metal skin, for example with a nickel or copper skin. The metal of the skin is selected with a view towards the galvanic bath in which the bodies are to be used; suitable metals are copper, nickel, silver, and the like.

Various changes and modifications may be made within the scope of the inventive concept. Without any disadvantage the shape of the cores according to the invention may be of any kind, e.g. balls, (FIG. 2) cylinders, (FIG. 1) cones (FIG. 3) or polygons like tetraeders, hexaeders, octaeders, pyramids or polygonal cylinders, i.e., prisms (FIG. 4) etc., provided that they are made of material the specific gravity of which is adapted to those of the components to be contacted.

I claim:

1. In a galvanic bath, a method of contacting electrically conductive material coated on structural, insulating material, forming electrical, or electronic structural and circuit components comprising the step of
    mixing said components in the bath with contact elements having a core (1) made of a material of specific gravity having about the same order of magnitude as the specific gravity of the components and a metallic skin (3) essentially entirely covering said core (1);
    and agitating together, said components and said elements.

2. Method according to claim 1, wherein the core (1) comprises at least one of: ceramic, glass, plastic.

3. Method according to claim 2, wherein the metallic skin (3) on the element comprises nickel.

4. Method according to claim 3, wherein the components to be contacted comprise ceramic components with electrically conductive material at selected exposed portions thereof;
    and wherein the core (1) of said element comprises steatite.

5. Method according to claim 1, wherein the core is essentially cylindrical.

6. Method according to claim 5, wherein the essentially cylindrical core (1) has a length which is approximately of the same dimension as the diameter of the core.

7. Method according to claim 5, wherein the essentially cylindrical core (1) has rounded edges (2) at the intersection of the cylindrical surface of the core (1) and the end faces thereof.

8. Method according to claim 7, wherein the essentially cylindrical core (1) has a length which is approximately of the same dimension as the diameter of the core.

9. Method according to claim 8, wherein the cylindrical core (1) comprises at least one of: steatite; a ceramic other than steatite; glass; plastic;
    and wherein the metallic skin comprises nickel.

10. Method according to claim 5, wherein the element has a length of about 3 mm, and a diameter of about 3 mm.

11. Method according to claim 9, wherein the element has a length of about 3 mm, and a diameter of about 3 mm.

12. Method according to claim 1, wherein the core is essentially ball-shaped.

13. Method according to claim 1, wherein the element is essentially cone-shaped.

14. Method according to claim 1, wherein the element comprises a polygon including at least one of: a pyramid, a tetrahedron; a hexahedron; an octohedron.

15. Method according to claim 14, wherein the core has rounded edges at the intersection of surfaces thereof.

16. Method according to claim 1, wherein the core has a shape which defines intersecting surfaces; and said surfaces are formed with rounded edges at the intersection thereof.

17. Method according to claim 1 wherein (FIG. 4) the element comprises a polygonal cylinder.

* * * * *